United States Patent [19]
Abita et al.

[11] 3,951,659
[45] Apr. 20, 1976

[54] METHOD FOR RESIST COATING OF A GLASS SUBSTRATE

[75] Inventors: Joseph L. Abita, Columbia; Jack G. Bebee, Derwood, both of Md.

[73] Assignee: The United States of America as represented by the Secretary of the Navy, Washington, D.C.

[22] Filed: Dec. 9, 1974

[21] Appl. No.: 531,148

[52] U.S. Cl......................... 96/36; 65/30 R; 134/26; 156/15; 427/299
[51] Int. Cl.²........................ C03C 15/00
[58] Field of Search........................ 156/13, 15, 24; 427/307, 314, 299; 65/60, 30, 111; 134/2, 30, 29, 26; 96/36, 36.2; 252/DIG. 10

[56] References Cited
UNITED STATES PATENTS

| | | | |
|---|---|---|---|
| 3,023,139 | 2/1962 | Van Tetterode | 156/24 |
| 3,097,961 | 7/1963 | Duperriez | 427/314 |
| 3,542,612 | 11/1970 | Cashau et al. | 156/15 |
| 3,625,728 | 12/1971 | Blome et al. | 96/36 |
| 3,764,545 | 10/1973 | Aguadisch et al. | 252/DIG. 10 |
| 3,911,169 | 10/1975 | Lesaicherre et al. | 96/36.2 |

*Primary Examiner*—William A. Powell
*Assistant Examiner*—Jerome Massie

[57] ABSTRACT

A method for preparing the surface of a glass substrate so that resist material may be directly applied to the surface and adhere thereto. The invention is particularly useful in the fabrication of relief masks used for pattern generation in planar thin film overlays, which masks are used to provide intimate contact between a photoresist surface and a masking pattern during exposure of the photoresist surface. The present method comprises cleaning of the glass substrate, boiling the substrate in trichloroethylene, and heating the substrate to between 160° and 200°C. Resist material may then be applied directly to the glass substrate.

4 Claims, 5 Drawing Figures

METHOD FOR RESIST COATING OF A GLASS SUBSTRATE

BACKGROUND OF THE INVENTION

A. Field of the Invention

The invention generally relates to mask construction techniques employed in photographic fabrication of microminiature electronic devices, particularly those devices requiring the use of high resolution photolithographic techniques.

B. Description of the Prior Art

Pattern generation in planar thin film overlays is usually accomplished by reproducing the pattern (or its negative) in a photosensitive resist applied to the film's surface. In order to obtain accurate delineation of the pattern, positive contact between the pattern mask and the photoresist surface is essential. Build-ups of photoresist material often occur around the perimeter of a substrate and thereby prevent contact between the pattern mask and the surface of the photoresist. Thus, the precise masking ability of the mask apparatus is of great importance. In the prior art, methods for making precise mask apparatus range from chemical buildup of the mask to mechanical construction thereof. Chemically fabricated masks require a number of processing steps both in the application of the mask and in the removal thereof. Mechanical masks therefore present certain advantages, such as reduction of fabrication time, reusability, etc. However, mechanical masks in high resolution work are susceptible to the aforementioned difficulties associated with excessive photoresist deposits around the perimeter of a substrate which prevent intimate contact between the masking pattern and the surface of the substrate.

A relief mask, such as is disclosed in U.S. Pat. No. 3,824,014 can be used to provide the intimate contact required to produce accurate pattern generation. The present invention provides a method which is useful inter alia to fabricate such a relief mask. The method of the present invention is an improvement over the method for making a relief mask disclosed in U.S. patent application Ser. No. 473,107, filed May 24, 1974, now abandoned. In the method of said patent application Ser. No. 473,107, a thin layer of gold is deposited on a glass substrate after the usual cleaning of the substrate to enable photoresist material to adhere to the thin gold layer, which gold layer adheres to the glass substrate. As taught by the prior method, the gold layer was necessary to enable the adherence of the photoresist material to the substrate, the photoresist material not being capable of direct adhesion to the glass substrate. On development of the photoresist and removal of desired portions thereof, portions of the gold layer had to be removed to allow etching of selected areas of the surface of the glass substrate. Thus, several unit operations, i.e., the deposition of gold, the subsequent removal of portions thereof, and finally the removal of the remaining portions thereof, were required in the practice of the prior method which are no longer required due to the teachings of the present invention.

SUMMARY OF THE INVENTION

Photolithographic techniques have long been used to produce circuit patterns in thin film overlays necessary for hybrid and semiconductor microelectronic package fabrication. A usual step in these processing techniques requires the application of photoresist material onto a substrate, the substrate subsequently being covered by a masking device so that a particular circuit pattern may be developed on the surface of the substrate. Glass substrates have typically been covered with a thin layer of gold in order to enhance adherence of the photoresist material to the substrate. The present method, however, negatives the need for an intermediate gold deposition step and allows direct application of photoresist material to a substrate, particularly to a glass substrate.

The present invention is useful not only in the fabrication of relief masks as indicated above but also in any microelectronic fabrication technique in which the surface of a glass substrate is to be masked for etching of the substrate or for removal or portions of the surface of the substrate. The present method generally comprises the steps of:

1. cleaning the glass substrate in detergent solution;
2. boiling the cleaned substrate in trichlorethylene; and,
3. heating the substrate to between 160° and 200°C.

It is therefore a primary object of the invention to provide a reliable and rapid method for applying photoresist material to a substrate, particularly a glass substrate.

Further objects and advantages of the invention will become apparent in light of the following description of the preferred embodiment of the invention.

DESCRIPTION OF THE PREFERRED EMBODIMENT

The present invention provides a method for coating a substrate, particularly a glass substrate, with a layer of photoresist material. The present method allows direct application of resist material to a substrate with a high level of adherence of the resist material to said substrate.

Figure 1:
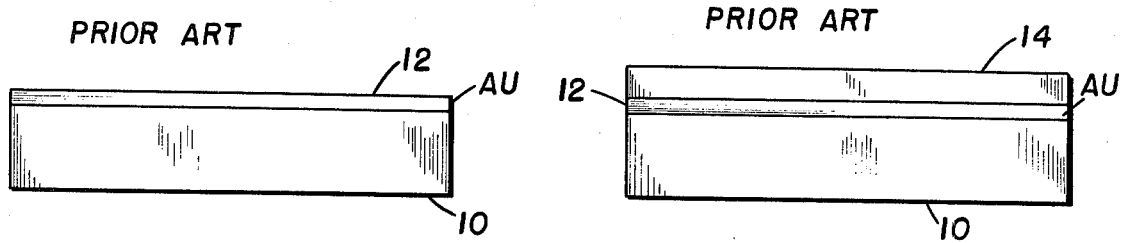
FIG. 1 is an elevational view of a substrate onto which a gold layer has been deposited prior to photoresist coating according to the teachings of the prior art.
Figure 2:
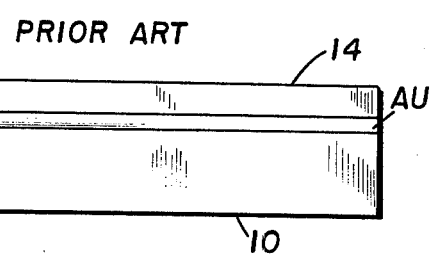
FIG. 2 is an elevational view of the prior art assembly of FIG. 1 onto which a photoresist layer has been deposited according to the teachings of the prior art.
Figure 3:
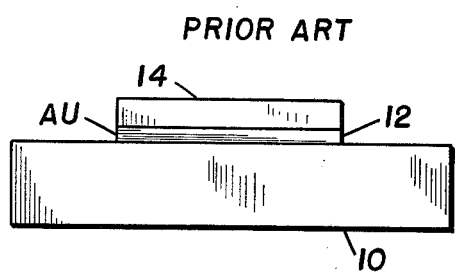
FIG. 3 is an elevational view of the prior art assembly of FIG. 2 after exposure, curing, and etching operations have been performed thereon.

Referring to FIGS. 1, 2, and 3, a prior art method is shown in order to compare the advantages of the present method thereover. As seen in FIGS. 1, 2, and 3, a blank substrate 10 is shown to have a thin layer 12 of gold deposited thereon in order to increase the adherence of a layer 14 of photoresist material deposited onto the layer 12. Without the gold layer 12 intermediate of the substrate 10 and photoresist layer 14, the layer of photoresist would only poorly adhere to the substrate. The etched assembly shown in FIG. 3 is produced by exposure and development of portions of the photoresist layer 14. Portions of the layer 14 may thus be removed. In prior art methods, the gold layer 12 surmounting certain portions of the substrate 10 must then be removed by etching. The prior art is thus seen to involve several steps directed to applying and subsequently removing a thin layer of gold in order to insure adherence of a layer of photoresist material to the substrate. It is easily seen that a number of time-consuming processing steps are required in the prior art methods. Further, valuable gold must be destructively utilized.

Figure 4:
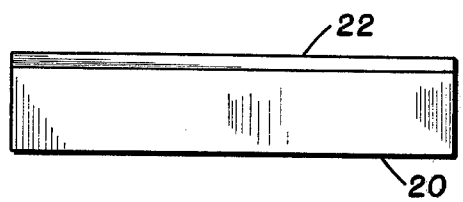
FIG. 4 is an elevational view of a substrate treated according to the present method and onto which a layer of photoresist material has been deposited; and, FIG. 5 is an elevational view of the article of FIG. 4 after exposure, curing, and etching operations have been performed thereon.
Figure 5:
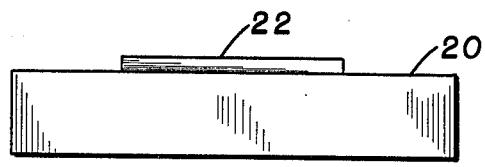

The present method avoids several of the time-consuming steps of prior art methods by eliminating the necessity for the intermediate layer of gold between the photoresist material and the substrate. A substrate 20 which may even be comprised of photoplate glass, is seen in FIG. 4 to be directly coated with a layer 22 of photoresist material. According to the present method, the substrate 20 is cleaned in a normal manner, such as by ultrasonic agitation in a detergent solution followed by boiling distilled acetone rinses. The substrate 20 is then boiled in trichloroethylene and subsequently is heated to a temperature between 160°C and 200°C. The photoresist layer 22 may then be directly applied to the substrate 20. An example of such a photoresist material is the photopolymer dry film resist such as is produced by Dynachem Corporation. Masking techniques are then used to expose the photoresist layer 22 in order to define relief areas, development of the exposed portions of the photoresist layer 14 producing the structure shown in FIG. 5. The surface of the substrate 20 may then be etched in a room temperature bath of HF/H$_2$O solution to produce a desired pattern.

The present method yields superior results when compared to prior methods which involve the use of gold to enable adhesion of the photoresist material to the substrate. Additionally, the present method is more economical since fewer steps are required in its practice. The present method comprises the steps of:

1. cleaning a glass substrate, a surface of which is to be formed with a predetermined pattern;
2. boiling the substrate in trichloroethylene;
3. heating the substrate to between 160°C and 200°C;
4. applying a layer of photoresist material directly to the substrate;
5. removing portions of the photoresist layer to expose predetermined portions of the surface of the substrate; and,
6. etching or otherwise treating the exposed portions of the surface of the substrate to produce the predetermined pattern thereon.

Practice of the essential steps of the present method allows the application of photoresist material to a substrate with a desired degree of adhesion. After development of the photoresist material and the subsequent unit operations involving chemical removal of selected portions thereof and etching or other treatment of portions of the substrate surface not masked by the photoresist layer 22, the remaining photoresist material may be easily removed chemically, such as by use of a "stripper", or mechanically, such as by agitation.

What is claimed is:

1. A method for providing a coating of a photoresist material directly onto the surface of a glass substrate, comprising the steps of:
   cleaning the substrate;
   boiling the substrate in trichloroethylene;
   heating the substrate to a temperature between 160°C and 200°C; and,
   applying photoresist material directly onto the surface of the substrate.

2. The method of claim 1 and further comprising the steps of:
   removing portions of the photoresist material from the surface of the substrate to expose predetermined portions of said surface; and,
   treating the exposed portions of the surface of the substrate to produce a predetermined pattern thereon.

3. The method of claim 2 wherein the removing step comprises the steps of exposing and developing preselected portions of the photoresist material.

4. The method of claim 2 wherein the treating step comprises the step of etching the exposed portions of the substrate surface.

* * * * *